United States Patent [19]
Tanaka et al.

[11] Patent Number: 6,107,734
[45] Date of Patent: Aug. 22, 2000

[54] ORGANIC EL LIGHT EMITTING ELEMENT WITH LIGHT EMITTING LAYERS AND INTERMEDIATE CONDUCTIVE LAYER

[75] Inventors: Shosaku Tanaka, Tottori; Chishio Hosakawa, Sodegaura, both of Japan

[73] Assignee: Idemitsu Kosan Co., Ltd., Japan

[21] Appl. No.: 09/161,503

[22] Filed: Sep. 28, 1998

[51] Int. Cl.$^7$ ................................................. H01J 63/04
[52] U.S. Cl. ......................................... 313/506; 313/505
[58] Field of Search .................................. 313/506, 498, 313/505, 502

[56] References Cited

U.S. PATENT DOCUMENTS 5,896,006   4/1999   Kusaka et al. ........................... 313/506

*Primary Examiner*—Vip Patel
*Attorney, Agent, or Firm*—Parkhurst & Wendel, L.L.P.

[57] ABSTRACT

An organic EL light emitting element and a light emitting device capable of realizing inexpensively a display which a scanning line current is suppressed and which is large size and high-resolution is provided. The organic EL light emitting element 6 is constituted from a transparent electrode 2; an opposed electrode 3 arranged in a manner to oppose to this transparent electrode 2; an intermediate conductive layer 4 of "n" sheets ($1 \leq n \leq 100$); and an organic layers 5 comprising at least an organic light emitting layer, the organic light emitting layer being arranged between the transparent electrode 2 and the opposed electrode 3 in a manner to sandwich the intermediate conductive layer 4 in an intermediate position. These organic EL light emitting element 6 are arranged in one dimension or in two dimensions, whereby the light emitting device 10 is constituted.

10 Claims, 6 Drawing Sheets

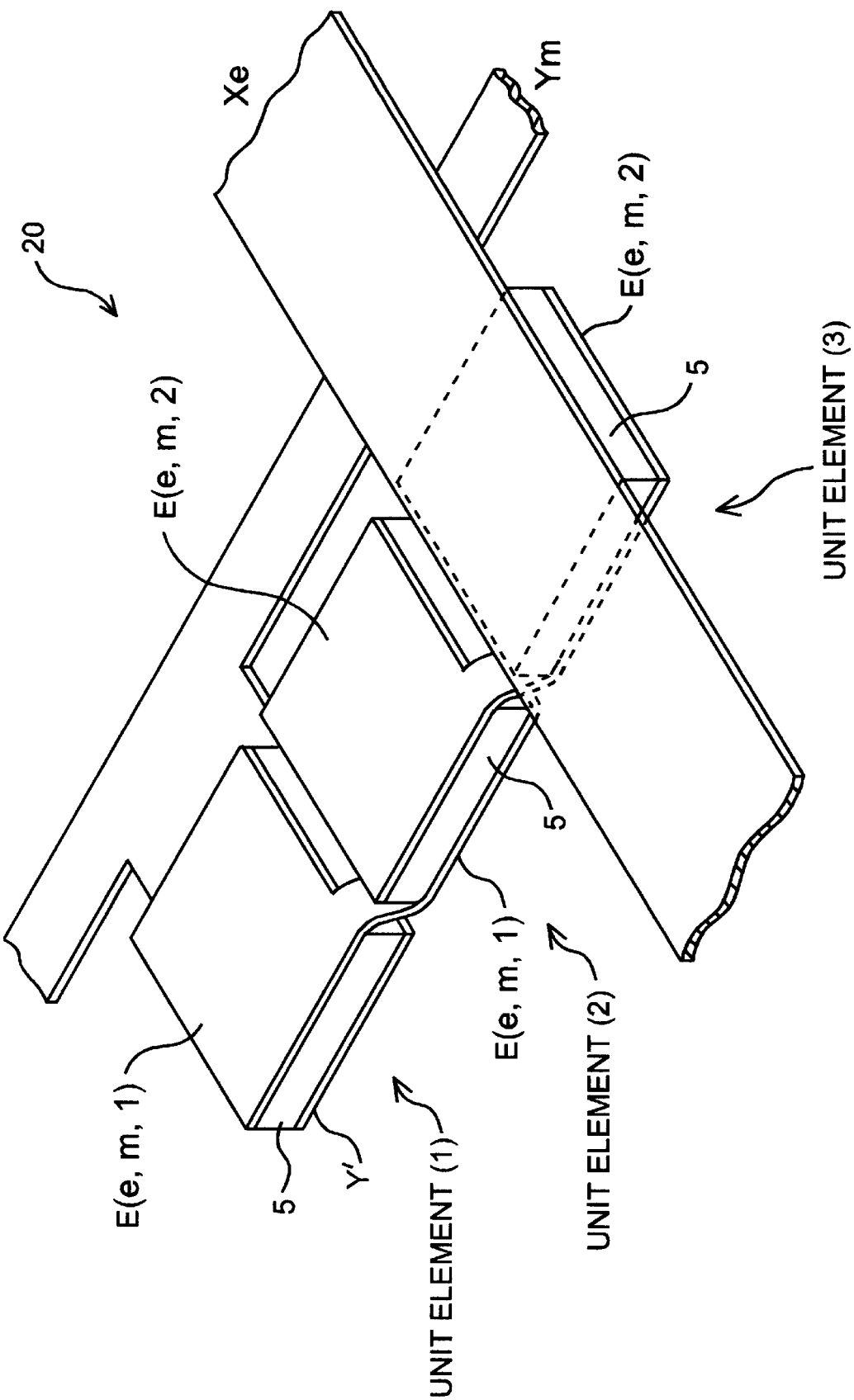

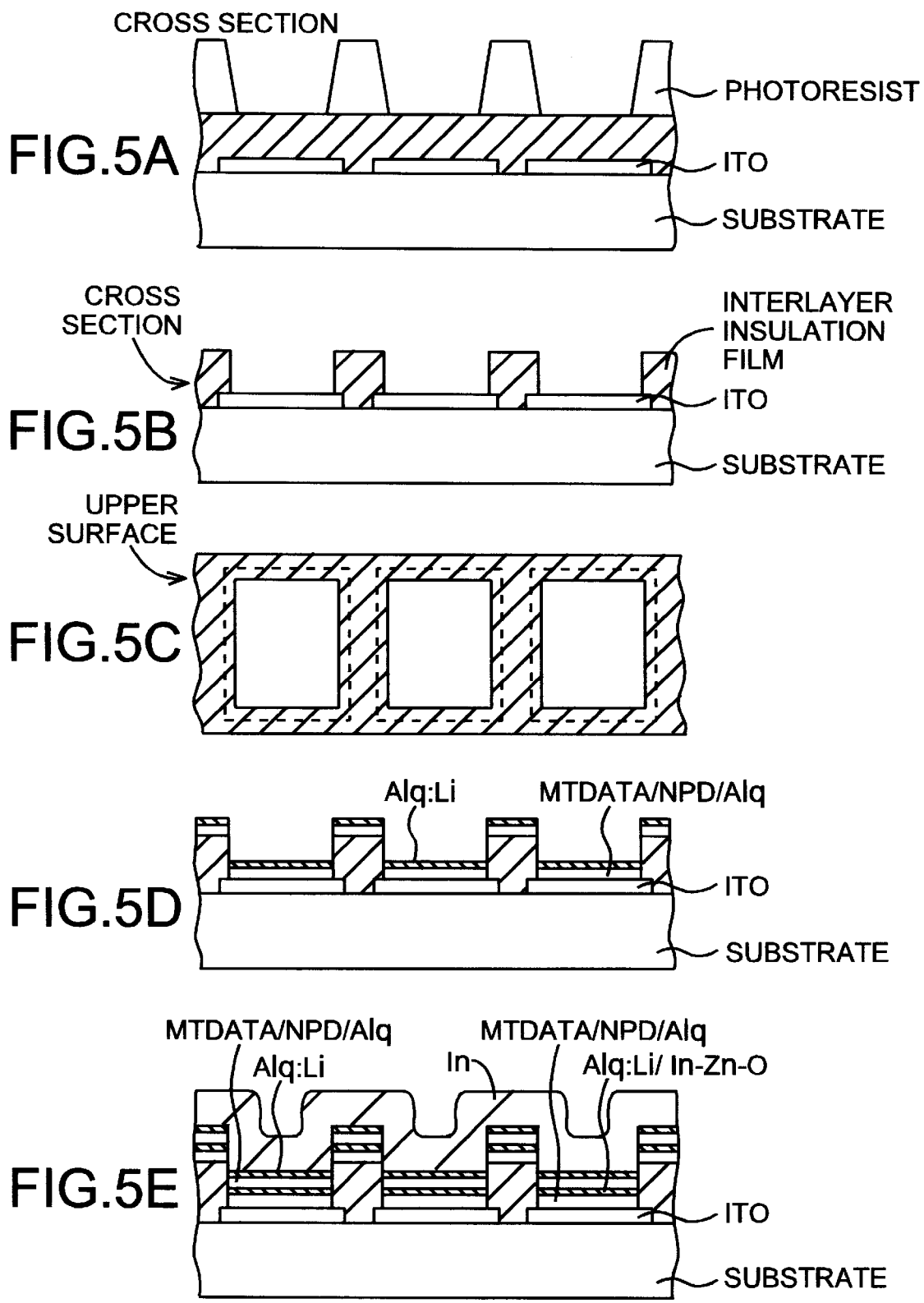

ORGANIC EL LIGHT EMITTING ELEMENT WITH LIGHT EMITTING LAYERS AND INTERMEDIATE CONDUCTIVE LAYER

BACKGROUND OF THE INVENTION

1. Technical Field of the Invention

The present invention relates to an organic EL light emitting element and an organic EL light emitting device using the same. More particularly, the present invention relates to the organic EL light emitting element and the organic EL light emitting device for realizing a large size and high-resolution display.

2. Related Art

As the light emitting device, the organic EL light emitting element using organic substance has been noted and recently, has been utilized in a display or the like.

FIG. 6 (A) and (B) show an prior X-Y matrix type light emitting device using the organic EL light emitting element. This X-Y matrix type light emitting device is constituted by X electrode lines Xe−2, Xe−1, Xe, Xe+1, . . . formed into a strip shape; strip-shape Y electrode lines Ym−1, Ym, Ym+1, . . . arranged in the direction perpendicular to these X electrode lines Xe−2, Xe−1, Xe, Xe+1, . . . and an organic substance layer 2 including at least an organic light emitting layer, the organic substance layer being arranged between these X electrode lines Xe−2, Xe−1, Xe, Xe+1 and Y electrode lines Ym−1, Ym, Ym+1, . . . .

In this structure, in order to allow a pixel which is positioned at an optional coordinate location in the X-Y coordinates to emit light, for example, when defining the direction of the X axis as a scanning line, first, one line of the X electrode lines Xe−2, Xe−1, Xe, Xe+1, . . . is selected and a voltage of 0 V is applied thereto, and a negative voltage is applied to another X electrode lines Xe−2, Xe−1, Xe, Xe+1, . . . . On the other hand, in correspondence with the pixel which is expected to emit light in the X electrode lines Xe−2, Xe−1, Xe, Xe+1, . . . selected, a positive voltage is applied to one line of the Y electrode lines Yn−1, Ym, Ym+1, . . . which are signal lines of the direction of the Y axis, and the negative voltage or 0 V is applied to the Y electrode lines Ym−1, Ym, Ym+1, . . . corresponding to the pixel which is not expected to emit light. Therefore, the pixel which is positioned at the desired coordinate can be allowed to emit light. Moreover, although it is considered to be that the X electrode lines is defined as a negative electrode and the Y electrode lines as a positive electrode, the pixel can be driven in same manner by the method also other than this method.

SUMMARY OF THE INVENTION

Incidentally, although for an organic light emitting material used in the organic EL light emitting element various materials have been developed, the efficiency had been $\eta=10$ cd/A to 17 cd/A at the maximum. Therefore, in order to realize a display having a large diagonal of over 10 inches, and a high-resolution display which the number of the pixel is over (320×240) pixels, the following points have become problems.

(1) In the high-resolution display, the scanning line becomes N pieces (N>100). Therefore, momentarily, N times of brightness Lo (nit) to be excepted, that is, LN (nit) is required. At this time, a current density is $$I=LN/\eta(A/m^2)=LN/\eta \times 10^{-4} \ (A/m^2)=LN/\eta \times 10^{-1} \ (A/cm^2)$$

When defining brightness to be excepted Lo=200 (nit), therefore, the current density shown in the following Table are required. (At $\eta=10$ cd/A)

TABLE 1

| N | I [mA/cm$^2$] | Scanning line current (at the surface area of 0.6 cm$^2$) |
|---|---|---|
| 100 | 200 | ≈120 |
| 200 | 400 | ≈240 |
| 300 | 600 | ≈360 |
| 400 | 800 | ≈480 |
| 500 | 1000 | ≈600 |

(2) Since as described above, a large current density is required, (a) due to the resistance of the scanning lines and the signal lines a voltage drop is enlarged, so that power consumption is increased. (b) A driving circuit capable of injecting a large current is required, whereby due to an enlargement in dimension of the driving circuit a compact display can not be realized.

(3) Moreover, since as progressing in the high resolution, the scanning line and the signal lines are harrowed in width, so that the increase in resistance is occurred, and CR time constant is enlarged, so that the response of the elements is delayed, thereby interfering with the case of obtaining a moving picture.

(4) Furthermore, since for a need to realize a television set, brightness of over 300 nit is required, these problems become further unenviable.

Moreover, as a method capable of solving the problems described above, EP No. 0717445 has been known.

In this EP No. 0717445, the organic EL light emitting device driven by a TFT using a polysilicon TFT has been disclosed. It has been disclosed that when in order to realize a display having the pixel size of 200$\mu$ square and the number of the pixel of 1000×1000, according to a direct matrix system a scanning line current of 2 A/cm$^2$ is required and in addition, because of a voltage drop due to a scanning line resistance and a signal line resistance, it can not be driven practically. In this patent, it is attempted to solve this problem by using the TFT.

However, a manufacturing process of the polysilicon TFT is long and the cost of manufacture is also high. Accordingly, the display also becomes expensive, whereby the merit is insignificant.

It is the object of the invention to provide an organic EL light emitting element and a light emitting device capable of realizing inexpensively a display which a scanning line current is suppressed and which has large size and high-resolution.

The organic EL light emitting element according to the invention comprise a transparent electrode;

an opposed electrode arranged in a manner to oppose to this transparent electrode;

an intermediate conductive layer; and a plurality of organic light emitting layers arranged between the transparent electrode 2 and the opposed electrode 3 in a manner to sandwich the intermediate conductive layer 4 in the intermediate position.

The light emitting device according to the invention comprises the structure that the organic EL light emitting elements are arranged as the pixel into one dimensional or two dimensional arrangement.

Here, the intermediate conductive layers of each pixel are separated from not only the intermediate conductive layer of the adjacent pixels but also a power source. The number of the intermediate conductive layers in each pixel may be optional, but realistically, the number is less than 100, that is to say, $1 \leq n \leq 100$.

Therefore, since the organic EL light emitting element according to the invention is constituted by the structure that in a manner to sandwich the intermediate conductive layers in the intermediate position, a plurality of organic light emitting layers are connected in series, for example, when defining a driving voltage of the pixels constituting the prior X-Y matrix type light emitting device as $V_0$, a driving current as $i_0$, and an electrostatic capacity of the pixel as $C_0$, the driving voltage of the pixels (possessing the organic light emitting layer of "n" pieces and the intermediate conductive layer of n–1 pieces) according to the invention becomes "n"$\times V_0$, the driving current $i_0$/"n", and the electrostatic capacity $C_0$/"n". However, the brightness of the pixel is defined as the same as the prior one, and an unit element (the unit element constituted by sandwiching the organic light emitting layer between the intermediate conductive layer and the electrode) is defined as the same as the pixel of the prior X-Y matrix type.

In other words, although in order to magnify the brightness of the pixel by "n" times, in the case of the prior X-Y matrix type light emitting device, the driving current should be magnified by "n" times, and although according to the invention the driving voltage is magnified by "n", the driving current may be the same. That is to say, when the brightness is defined as the same, although according to the invention the driving voltage is magnified by "n" of the prior type, the driving current may be 1/n of the prior type, whereby the voltage drop due to the scanning line resistance and the signal resistance becomes 1/n. Therefore, the following effects can be expected.

It has been problem that in the prior light emitting device, the scanning line current is large, so that the voltage drop is large, whereby the increase in power consumption is caused, and on the other hand, in the light emitting device which is high-resolution and has the large diagonal, the scanning line current becomes approximate 1 A, so that realistically, the device can not be driven.

However, according to the invention, the driving current becomes 1/n of the prior type, and the power consumption also is decreased, whereby the display which is higher-resolution and has the larger diagonal, for example, the display which is over 12 inches SVGA (the number of the pixel 800×600, a pixel pitch 110 μm×330 μm) also can be realized.

Moreover, although in order to perform a video-rate picture a high speed response of the pixel is required, heretofore, the time constant $\tau_0 = R_0 \times C1$ which is defined by the product of a wiring resistance $R_0$ and the electrostatic capacity C1 which relates at driving is large, so that the value has reached to several μs to tens of μs. Therefore, rising and falling of the driving waveform are delayed, so that a hindrance has been caused in the moving picture display.

According to the invention, the electrostatic capacity $C_0$ becomes 1/n, and in addition, the electrostatic capacity C1 which relates at driving also becomes 1/n. Accordingly, the time constant becomes $\tau_0 = R_0 \times (C1/n)$, so that the response is performed at high speed, whereby the moving picture display with fine quality also can be performed. Moreover, the electrostatic capacity C1 is not identical to the electrostatic capacity $C_0$ and the relationship therebetween becomes approximate C1=$C_0$×(the number of the pixel of the longitudinal direction), depending on the driving system.

In the above description, with regard to the arrangement and the structure of the transparent electrode, the intermediate conductive layer and the opposed electrode constituting the organic EL light emitting element, it may be the structure that the transparent electrode, the intermediate conductive layer and the opposed electrode are laminated in a manner to overlap each other at viewing through a plane, or the structure that a first unit light emitting element arranging an organic light emitting layer between the transparent electrode and a first intermediate conductive layer; and an "n" th unit light emitting element arranging the organic light emitting layer between the "n" th intermediate conductive layer and the opposed electrode are arranged side by side in one plane.

Especially, in the case of the former structure, the increase in element density of the pixel can be performed as compared with the latter structure.

Moreover, the first unit light emitting element arranging the organic light emitting layer between the transparent electrode and the first intermediate conductive layer; and the "n" th unit light emitting element arranging the organic light emitting layer between the "n" th intermediate conductive layer and the opposed electrode possess preferably at least a rectifying ability.

Here, when defining the rectifying ability as $10^3$ or more, more preferably $10^6$ or more, crosstalk can be prevented According to the invention, the unit light emitting elements which possess the intermediate conductive layer are coupled in a multi-stacked form, whereby the rectifying ability is facilitated to obtain There has been the problems that since the prior element is constituted by the unit light emitting element of one piece, the element defects in rectifying ability tends to occur and the crosstalk tends to occur.

In this connection, as a technology similar to the structure of the invention, WO No.95/06400 has been known.

This WO No.95/06400 has been devised for a purpose laminating a first organic light emitting element and a second organic light emitting element to mix a first emission color and a second emission color, or in order to obtain the effect for multi-coloring, and because of the structure that a individual voltage is applied to each organic light emitting element respectively, the WO No.95/06400 differs from the structure of the invention which possesses the intermediate conductive layer. Moreover, the effect based on the structure of the organic light emitting layer that the intermediate conductive layer according to the invention is sandwiched in the intermediate position also is not shown at all.

BRIEF DESCRIPTION OF THE DRAWINGS

FIG. 4 is a perspective view showing principles of a second embodiment of a light emitting device according to the invention.

FIGS. 5A–5E are a illustration illustrating a manufacturing method of a first embodiment according to the invention.

Figure 1:
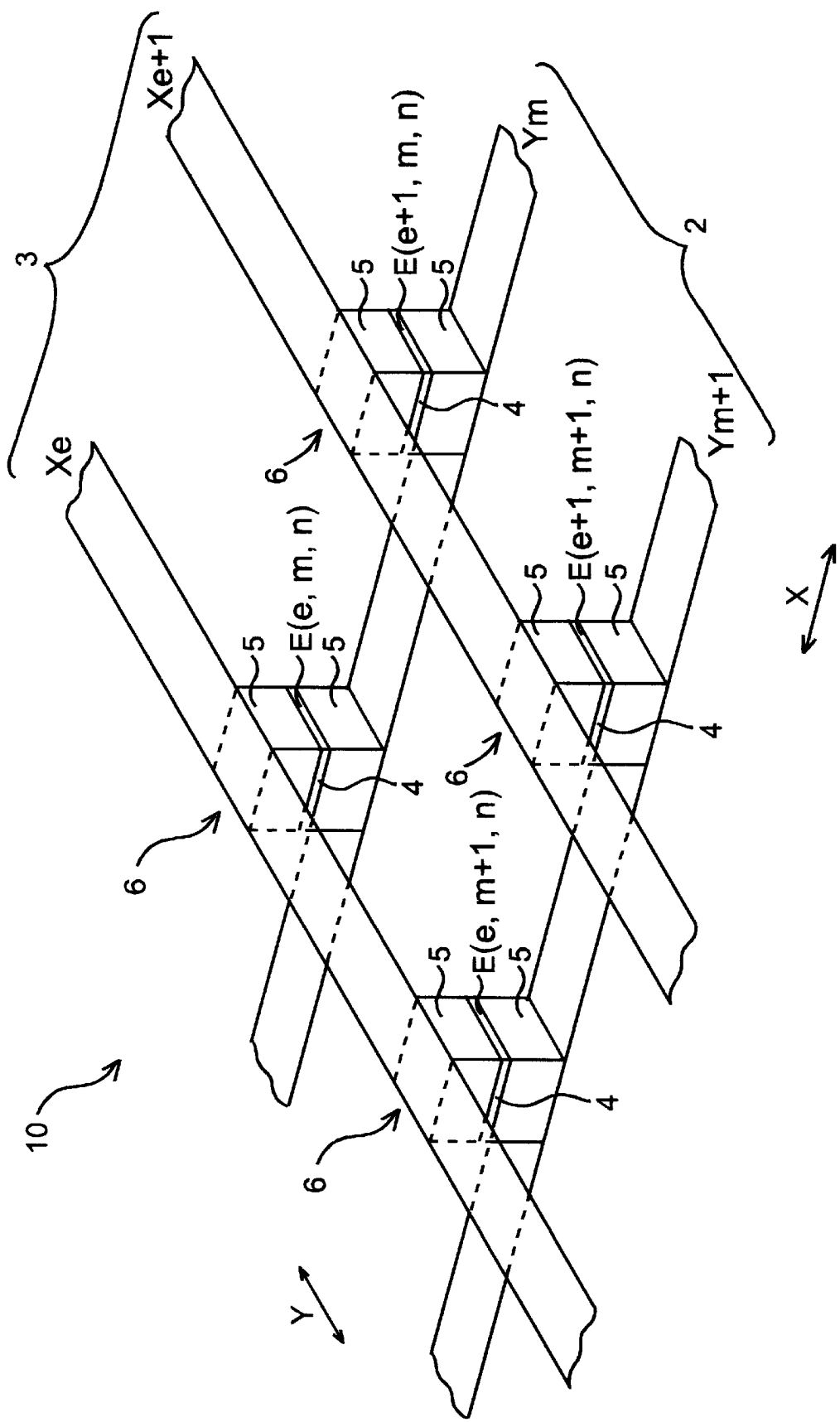
FIG. 1 is a perspective view showing principles of a first embodiment of a light emitting device according to the invention.

[Description of the Symbols]
2 transparent electrode
3 opposed electrode
4 intermediate conductive layer
5 organic layer
6 organic light emitting layer
7 interlayer insulation film
10 light emitting device
20 light emitting device
Ym, Ym+1, . . . Y electrode lines
Xe, Xe+1, . . . X electrode lines
E (e, m, n) . . . E (e+1, m+1, n) intermediate conductive layers

DETAILED DESCRIPTION OF PREFERRED EMBODIMENTS

A first embodiment

FIG. 1 shows a schematic structure of a first embodiment. As shown in FIG. 1, a light emitting device 10 of the first embodiment is provided with as pixels an organic EL light emitting element 6 including a transparent electrode 2 formed on a glass substrate (not shown), which becomes an anode;

an opposed electrode 3 arranged in a manner to oppose to this transparent electrode 2, which becomes a cathode;

an intermediate conductive layer 4 of "n" sheets ($1 \leq n \leq 100$); and a plurality of organic layers 5 containing at least an organic light emitting layer, the organic light emitting layer being arranged between the transparent electrode 2 and the opposed electrode 3 in a manner to sandwich the intermediate conductive layer 4 in the intermediate position and these pixels (the organic EL light emitting element 6) are arranged in two dimensions, that is to say, along with in the directions of the x-, and y-axis That is to say, an X-Y matrix type light emitting device is constituted.

Especially, the transparent electrode 2 is constituted by a plurality of y electrodes Ym, Ym+1 . . . having a transparency and arranged side by side in parallel each other and every a certain spacing.

The opposed electrode 3 is constituted by a plurality of Y electrode lines Ym−1, Ym, Ym+1, . . . intersected at right angles to these X electrode lines Xe−2, Xe−1, Xe, Xe+1, . . . and arranged side by side in parallel each other and every a certain spacing.

The intermediate conductive layer 4 is provided with the transparency, as well as one sheet thereof is arranged at the points which the Y electrode lines Ym−1, Ym, Ym+1, . . . and the X electrode lines Xe−2, Xe−1, Xe, Xe+1, . . . intersect each other and there between respectively. These layers are defined as E (e, m, n), E (e, m+1, n), E (e+1, m, n) and E (e+1, m+1, n). Moreover, a number "n" represents the number of the intermediate conductive layer arranged in each pixel 6, and in the embodiment the number "n" is "1". Moreover, the intermediate conductive layer E (e, m, n), E (e, m+1, n), E (e+1, m, n) and E (e+1, m+1, n) . . . in each pixel 6 is separated from the adjacent intermediate conductive layer E (e, m, n), E (e, m+1, n), E (e+1, m, n) and E (e+1, m+1, n) . . . in each pixel 6 as well as the power source connected to the electrode 2 and 3. Originally, the wiring capable of addressing the intermediate conductive layer E (e, m, n), E (e, m+1, n), E (e+1, m, n) and E (e+1, m+1, n) separately is not provided.

The intermediate conductive layer 4 can be defined as a layer capable of injecting holes to one primary surface side, and of injecting electrons to the other primary surface side and of keeping an approximate equipotential in the layer. As far as being applicable to this resolution, various semiconductors and metals having the transparency can be used, s well as a combination of the semiconductor and the metal also can be used.

The organic layers 5 are arranged at the points (in each pixel) which the Y electrode lines Ym−1, Ym, Ym+1, . . . and the X electrode lines Xe−2, Xe−1, Xe, Xe+1, . . . intersect, and between the Y electrode lines Ym−1, Ym, Ym+1, . . . and the intermediate conductive layer E (e, m+1, n), E (e+1, m, n) and E (e+1, m+1, n), and between the intermediate conductive layer E (e, m+1, n), E (e+1, m, n) and E (e+1, m+1, n) and the X electrode lines Xe−2, Xe−1, Xe, Xe+1, . . . .

Here, when defining a portion constituted by arranging the organic layers 5 containing at least the organic light emitting layer between each electrode 2 and 3, and the intermediate conductive layer 4 as an unit element, in this embodiment, the unit elements are laminated as overlapped each other at viewing through a plane. That is to say, the transparent electrode 2, the intermediate conductive layer 4 and the opposed electrode 3 are laminated as overlapped each other at viewing through a plane. Furthermore, these unit elements have the rectifying ability. The rectification ratio is $10^3$ or more, more preferably $10^6$ or more.

Moreover, as the unit element, the element which shows the identical emission color is preferable. Furthermore, for material of each layer (for example, a hole injecting layer, a hole transport layer, the light emitting layer and an electron injection layer) constituting the organic layer 5, each layer is preferably constituted by the identical material for each element. This imparts the effect that the manufacture is facilitated, and in addition, since the deposition conditions are fixed, the defects of the pixel are decreased. Moreover, even though there were leakage failures in the unit element positioned on the transparent electrode 2 directly, there is the effect that the leakage failures are dissolved by the unit element laminated, and in terms of the effect, under the condition of the identical materials and the fixed deposition conditions, the effect is more facilitated to obtain.

The light emitting layer may comprise two or more emitting layers. These layers may emit different colors. For example, a blue emitting layer and a red emitting layer are stacked to form one emitting layer. Other combination includes a blue and a green emitting layer, a green and a red emitting layer. A blue emitting layer and another blue emitting layer may be stacked to form one emitting layer.

Figure 2:
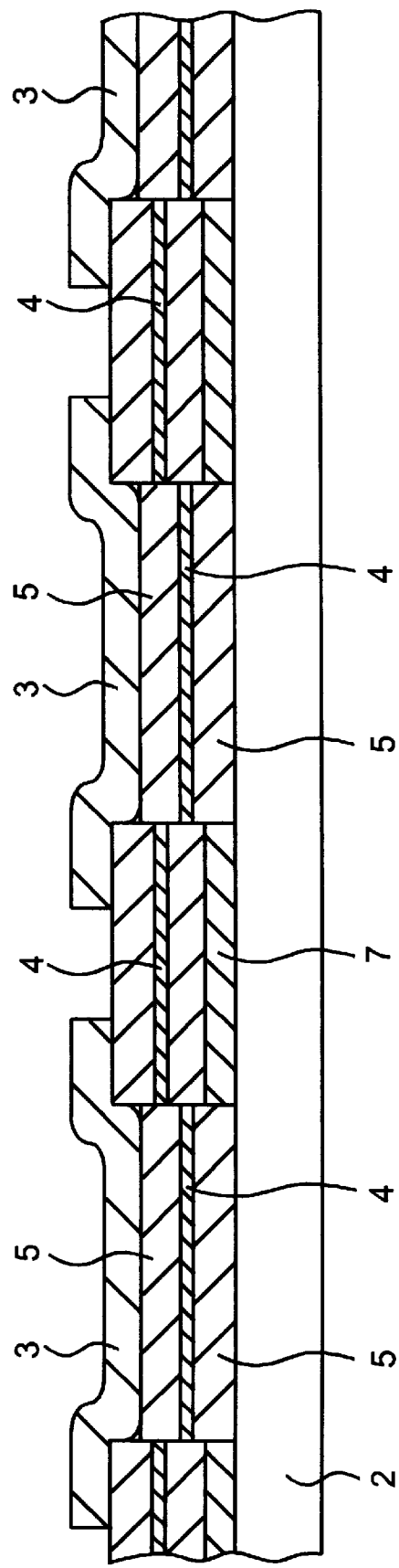
FIG. 2 is a sectional view showing a cross section of a first embodiment of a light emitting device according to the invention.
Figure 3:
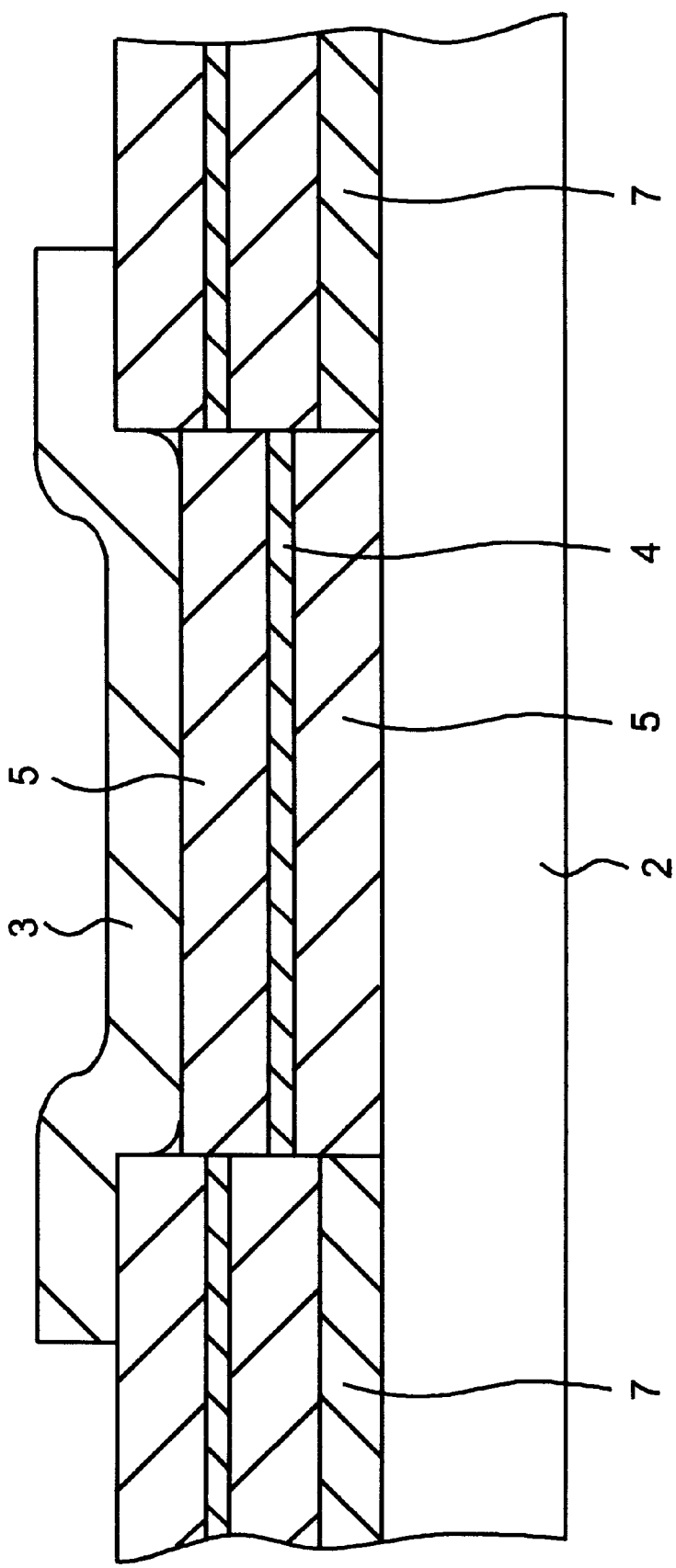
FIG. 3 is a partially enlarged view of FIG. 2.
Figure 6A:
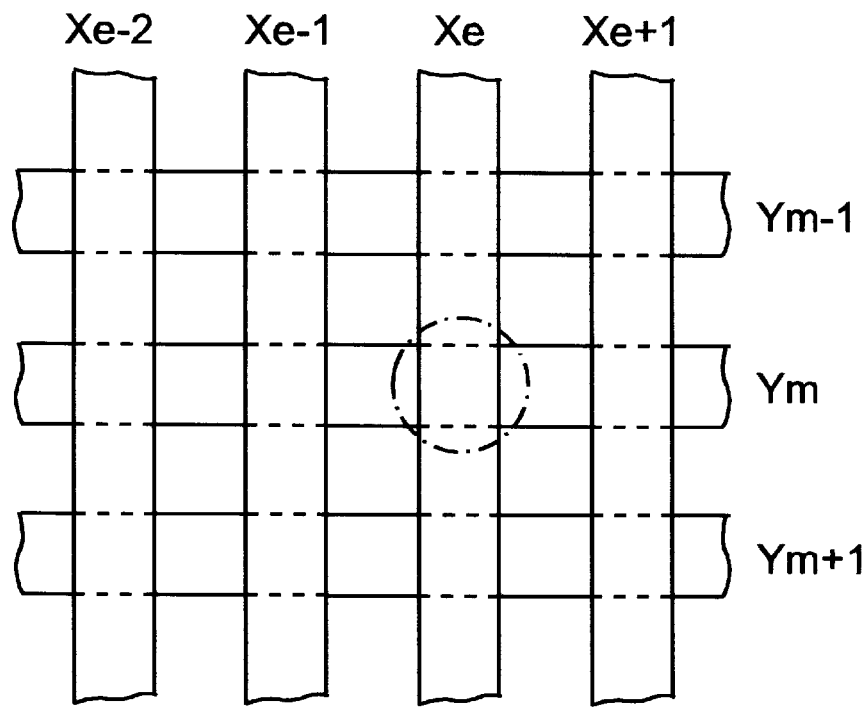
FIGS. 6A–6B are a plane view and the partially enlarged perspective view showing a prior X-Y matrix type light emitting device
Figure 6B:
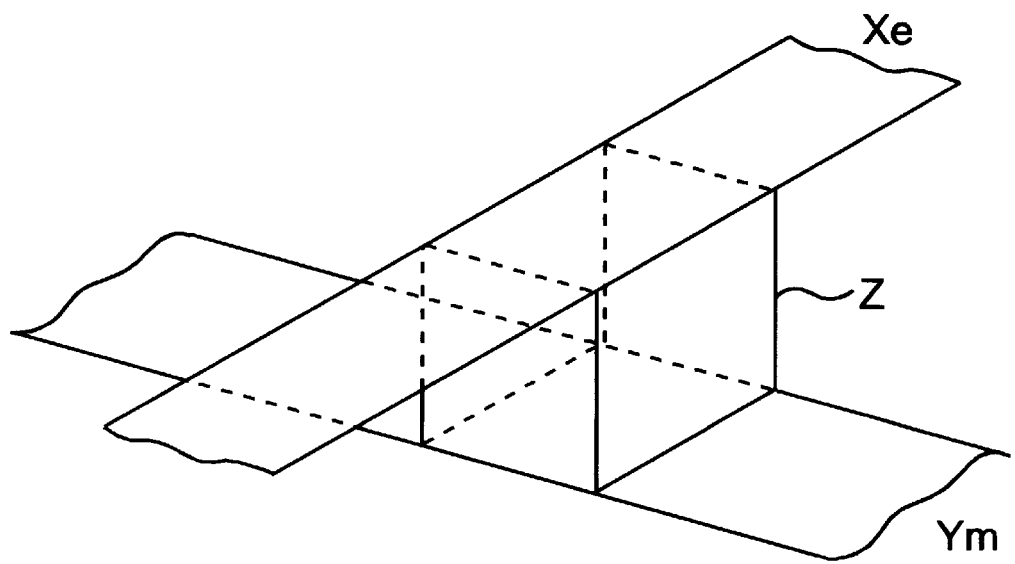

FIG. 2 shows more specifically a cross section of the light emitting device 10 shown in FIG. 1 described above. FIG. 3 is an enlarged view which a part thereof is enlarged.

As shown in these drawings, on the transparent electrode 2 and the substrate (not shown) an interlayer insulation film 7 is formed. The interlayer insulation film 7 is the layer with an insulating ability or a semiconducting property, and provides one part of a non-light emitting device portion. A stepped-face portion of the interlayer insulation film 7 is changed suddenly, thereby the intermediate conductive layer 4 being separated each other.

The interlayer insulation film 7 is an insulating ability film, an inorganic oxide film or an inorganic nitride film, specifically, $SiO_2$ ($1 \leq x \leq 2$), $SiN_x$ ($\frac{1}{2} \leq x \leq \frac{3}{4}$), SiON, SiAlON, SiOF or the like which a stepped-face processing can be performed.

Another preferable insulating ability films are high polymer films. Specifically, they are polyimide, polyacrylate, polyquinoline, polysiloxane, polysilane or the like.

A semiconductor film other than the insulating ability film may be used, as far as being able to perform a pixel separation. The preferable specific resistance is $10^{16}$ Ωcm to $10^5$ Ωcm. For example, it may be α-Si, α-SiC, α-SiN or the like.

Incidentally, for a manufacturing method of the light emitting device 10 described above, although various methods are considered, as preferable specified examples, the following methods are given:

(1) Deposition of the transparent electrode and patterning processing;

(2) Deposition and patterning processing of the interlayer insulation film which imparts the stepped face;

(3) Deposition of the organic light emitting layer including the organic light emitting layer (arranging the item (4) therebetween, to repeat the deposition by n+1 times);

(4) Deposition of the intermediate conductive layer; and (5) Preparation of the opposed electrode (deposition after the deposition of the item (3)).

(6) Sealing process.

Accordingly, for example, when repeating the item (3) by three times, it becomes the order of (1)→(2)→(3)→(4)→(3)→(5)→(7).

The above description is the manufacturing process of the invention and differs from the manufacturing method of the prior element in the process of the item (2) and the item (4). Moreover, it differs in the point of repeating the process of the item (3).

Moreover, this manufacture method is essential in the point of forming the stepped-face portion of the interlayer insulation film into a suddenly-changed shape and the angle is preferably 70° C. or more According to this forming, the intermediate conductive layer preferably deposited in the thickness of 20 nm to 0.5 nm is wire-broken, whereby the intermediate conductive layers of the adjacent pixels are electrically separated each other. Moreover, for a planar light emitting device (one pixel), it is ensured that the intermediate conductive layer is separated by the opposed electrode and the transparent electrode.

As the intermediate conductive layer, if being the layer capable of injecting holes from one primary surface side and of injecting electrons from the other primary surface side, as well as keeping the approximate equipotential in the layer, the various kinds can be used. To list preferable examples, they are:

(a) an urtra-thin film metal/the transparent electrode;

(b) a mixed layer of an electron transport ability compound and an electron injection ability compound/the transparent electrode;

(c) a mixed layer of a carbon compound and an alkali metal;

(d) a hole conducting ability organic layer/an electron conducting ability organic layer;

(e) P-type semiconductor/N-type semiconductor; and (f) a P-type conducting ability high polymer/a N-type semiconductor Furthermore, whatever one plane is hole injecting ability and the other plane is electron injecting ability, by combining from some which are used as the intermediate conductive layer of the item (a) to the item (f) such as the thin film metal, the transparent electrode, the mixed layer of the electron transport ability compound and the electron injection ability compound, the hole conducting ability organic layer or P-type or N-type semiconductor, the uses can be more preferably performed.

Furthermore, the intermediate conductive layer may comprise a semiconductor layer capable of injecting holes from one primary surface side and of injecting elements from the other primary surface side For example, they are item (b), item (c) and P or N-type semiconductor as described above. In addition, the intermediate conductive layer may comprise the layer of the electron injection ability compound/transparent electrode.

Especially preferable one in the described-above transparent electrodes is an In—Zn—O oxide film which can be deposited in a low temperature. In addition to this film, an amorphous ITO film also is preferable.

A preferable ultra-thin film metal is a Mg:Ag alloy, a Al:Li alloy, a Mg:Li alloy or the like which has the electron injection ability.

A preferable electron transport ability compound is a metallic complex of oxine or a cyclo-compound containing nitrogen.

The preferable electron injection ability compounds are the alkali metal, an alkaline earth metal, a rare earth metal and a compound containing these metals. For example, BaO, SrO, $Li_2O$, LiCl, LiF, $MgF_2$, $CaF_2$, CsF, CsCl, $Cs_2O$ or the like are the preferable electron injection ability compounds.

The semiconductor may show the one-dimensional conductance. By using the property, the adjacent pixels are electrically separated each other without deteriorating the current injection and without using the interlayer insulation.

The preferable P-type semiconductors are P-type α-Si, P-type-Si, P-type-CdTe, P-type-CuO, P-type-ZnTe or the like.

The preferable N-type semiconductors are N-type α-Si, N-type Si, N-type CdS, N-type ZnS, N-type-ZnSe, N-type-ZnSSe or the like.

As the P-type- or N-type conductive high polymer, the preferable macromolecules or polymers are polyarylanevinylene, polythenylenevinylane or the like.

A second embodiment

FIG. 4 shows a schematic structure of a second embodiment. As shown in FIG. 2, a light emitting device 20 of the second embodiment is the structure that three unit elements of the unit elements (1), the unit elements (2) and the unit elements (3) are arranged side by side.

An electrode Y' connected in a manner to being extended from the Y electrode line Ym arranges the organic layers 5 having the organic light emitting layer between the intermediate conductive layer E (e, m, 1) of the upper thereof, whereby the unit elements (1) is constituted. The intermediate conductive layer E (e, m, 1) is connected with the intermediate conductive layer E (e, m, 1) which is positioned at the lower of the unit elements (2) arranged side by side.

The intermediate conductive layer E (e, m, 1) arranges the organic layers 5 having the organic light emitting layer between the intermediate conductive layer E (e, m, 2) which is positioned at the upper thereof, whereby the unit elements (2) is constituted. The intermediate conductive layer E (e, m, 2) is connected with the intermediate conductive layer E (e, m, 2) which is positioned at the lower of the unit elements (3) arranged side by side.

The intermediate conductive layer E (e, m, 2) arranges the organic layers 5 having the organic light emitting layer between the X electrode line Xe which is positioned at the upper thereof, whereby the unit elements (3) is constituted. Moreover, these unit elements (1), the unit elements (2) and the unit elements (3) are provided with the rectifying ability.

Therefore, in the structure of the second embodiment also, between the electrode Y' extended from the Y electrode line Ym and the X electrode line Xe, two sheets of the intermediate conductive layer E (e, m, 1) and the intermediate conductive layer E (e, m, 2) are arranged, and the organic layers 5 having the organic light emitting layer is arranged therebetween, that is to say, between the Y electrode line Ym and the X electrode line Xe, three organic layers 5 are connected in series in a manner to sandwich the intermediate conductive layer E (e, m, 1) and the intermediate conductive layer E (e, m, 2) in the intermediate positions, whereby the comparably effect as the first embodiment can be expected.

EXAMPLE

Example 1

The substrate that on a glass substrate of 25 cm×75 cm×1.1 mm in size, an ITO (an indium tin oxide) electrode is deposited by 120 nm was set as a transparent supporting substrate. This ITO was processed into a stripe shape of pitch of 110 $\mu$m and 90 $\mu$m in width. A longitudinal length of the stripe is 20 mm and the number of the stripe is 600 pieces.

Next, as the interlayer insulation film, V259 which is a transparent acrylate resin (made by Shinnippon seitetu kagaku Co., ltd.) was applied by spin coating with 1.2 $\mu$m in thickness. Subsequently, this substrate was heated at the temperature of 200° to heat-cure an interlayer insulation film composed of V259.

Subsequently, on this V259 layer a photoresist was applied, and such that opening patterns as shown in FIG. 5 (A) are remained, exposure and development was performed through the photo mask. Furthermore, after drying this substrate at the temperature of 200° for one hour, using the photoresist of the shape shown in FIG. 5 (A) as the mask, reactive ion etching using oxygen gas was performed, thereby the interlayer insulation film of the opening being removed. What was obtained was the substrate having the cross section shown in FIG. 5 (B). Moreover, for the upper surface shape, refer to FIG. 5 (C).

Subsequently, to this substrate, ultrasonic cleaning was performed in isopropyl alcohol for five minutes, and in addition, cleaning using both an ultra violet and ozone simultaneously was performed for 30 minutes. This transparent supporting substrate was fixed in a vacuum evaporation equipment, and into three resistance heating boards, MTDATA (4, 4', 4"-tri {N-(methyl phenyl)-N-phenyl amino}triphenylamine) and NPD (N, N'-di-(1-naphtyl)-N, N'-diphenyl-4, 4'-benzidine) and Alq (aluminum complex of 8-hydroxyquinoline) was stored respectively. Moreover, an evaporation source for metallic Li is prepared. The vacuum evaporation equipment was exhausted to $1 \times 10^{-4}$ (Torr).

Subsequently, the MTDATA-stored board was heated thereby the hole-injecting layer of 120 nm in thickness being deposited.

Subsequently, the NPD-stored board was heated, thereby the hole transport layer of 10 nm in thickness being deposited.

Subsequently, the Alq-stored board was heated, thereby the light emitting layer of 40 nm in thickness being deposited, and in addition, metallic Li and Alq were evaporated with the mole ratio of 1:1 simultaneously. Although this Alq:Li layer acts as an electron injection layer, it may be considered as a part of the intermediate conductive layer, and the electron injection to the light emitting layer is performed.

This Alq is an example of an electron transport ability compound. The Li is an example of an electron injection ability compound.

The substrate (the substrate shown in FIG. 5 (D)) which the described-above depositions were performed was transferred to the vacuum chamber for sputtering coupled from a chamber for vacuum evaporation to this vacuum chamber. And then, as part of the intermediate conductive layer, In—Zn—O was deposited by 11 nm. The In—Zn—O was deposited using an In—Zn—O sputtering target of atomic ratio of 0.83 represented by In/(In/Zn) , with the sputtering power output 1.2 W/cm$^2$ using the mixed gas of Ar:O$_2$ of volume ratio 1000:1 as an atmosphere.

The In—Zn—O is an example of a transparent electrode.

Subsequently, the substrate which the described-above deposition are completed was returned to the chamber for vacuum evaporation and the MTDATA-stored board was heated, whereby the hole injecting layer of 120 nm in thickness was deposited.

Subsequently, the NPD-stored board was heated to deposit the hole transport layer of 10 nm in thickness.

Subsequently, the Alq-stored board was heated to deposit the light emitting layer of 40 nm in thickness, and in addition, metallic Li and Alq were evaporated with the mole ratio of 1:1 simultaneously.

Finally, In was deposited in the film thickness of 1.8 $\mu$m using the mask (the opening stripe patterns were provided with pitch of 400 $\mu$m and 90 $\mu$m in opening width by 20 pieces so as to become perpendicular to the ITO stripe) for evaporating a cathode and to be set as the cathode. The cross sections of the groups of the light emitting element (the light emitting device) prepared are shown in FIG. 5 (E).

With this description, preparation was completed, and when all of In stripes which were the cathodes of these groups of the light emitting element were kept at zero electric potential, the voltage of 15 V was supplied to all of the ITO stripes which were the anode, and nothing was connected to the intermediate conductive layer, current density of 3 mA/cm$^2$, brightness of 210 nit were obtained. The light-emitting efficiency was 7 cd/A.

COMPARISON EXAMPLES

Comparison Example 1

A comparison example 1 is the case having no intermediate conductive layer.

The groups of elements were prepared in same manner as the example 1. However, omitting the In—Zn—O intermediate conductive layer and evaporation of the hole injecting layer, the hole transport and the light emitting layer of the second times, the groups of the elements of the conventional structure were constituted. When all of In stripes which were the cathodes of the group of the light emitting element were kept at zero electric potential and the voltage of 7.35 V was supplied to all of the ITO stripes of the anode, current density of 3 mA/cm$^2$ and brightness of 100 nit were obtained. The light-emitting efficiency was 3.37 cd/A.

According to the above description, although in the element of the example 1, the voltage becomes approximate two times as compared with the comparison example 1, the light-emitting efficiency becomes approximate two times, whereby it is found that the increase in brightness is possible.

Example 2

A comparison example 2 is the case that the intermediate conductive layer comprises two sheets.

In same manner as the example 1, evaporation was performed up to Li:Alq layer of the second times.

The substrate which the described-above depositions were performed was transferred to the vacuum chamber for sputtering coupled from the chamber for vacuum evaporation to this vacuum chamber again. And then, as part of the intermediate conductive layer, In—Zn—O was deposited by 10 nm. The In—Zn—O was deposited using an In—Zn—O sputtering target of atomic ratio of 0.83 represented by In/(In+Zn), with the sputtering power output 1.2 W/cm$^2$ using the mixed gas of Ar:O$_2$ of volume ratio 1000:1 as an atmosphere.

Subsequently, the substrate which the described-above deposition are completed was returned to the chamber for vacuum evaporation and the MTDATA-stored board was heated, whereby the hole injecting layer of 120 nm in thickness was deposited.

Subsequently, the NPD-stored board was heated to deposit the hole electron transport layer of 10 nm in thickness. Subsequently, the Alq-stored board was heated to deposit the light emitting layer of 40 nm in thickness, and in addition, metallic Li and Alq were evaporated with the mole ratio of 1:1 simultaneously.

Finally, In was deposited in the film thickness of 1.8 μm using the mask (the opening stripe patterns were provided with pitch of 400 μm and 90 μm in opening width by 20 pieces so as to become perpendicular to the ITO stripe) for evaporating a cathode and to be set as a cathode.

With this description, preparation was completed, and when all of In stripes which were the cathodes of these groups of the light emitting element were kept at zero electric potential, the voltage of 23 V was supplied to all of the ITO stripes which were the anode, and nothing was connected to three sheets of the intermediate conductive layer, current density of 3 mA/cm$^2$, brightness of 303 nit were obtained. The light-emitting efficiency was 10.1 cd/A.

As described above, in this example, the element increased in brightness which had three times in brightness and approximately three times in light-emitting efficiency also, although the voltage was three times as compared with the comparison example 1 was obtained.

Moreover, in the described-above examples, although the example that the entire plane emits light is shown, it had been checked that a line sequential driving can be performed by the direct matrix system which the anode is used as the signal line and the cathode as the scanning line. As compared with the prior light emitting device, when feeding the same scanning line current, the brightness obtained in the light emitting devices of the example 1 and the example 2 was 2.02 and 2.95 times respectively and the element increased in brightness could be achieved.

Example 3

A comparison example 3 is the example that the intermediate conductive layer is an ultra-thin film metal of Mg:Ag/In—Zn—O conductive oxide film of Mg:Ag.

In same manner as the example 1, the element was prepared. However, it differed from the point that as a substitute of the intermediate conductive layer of the structure of the Li:Alq/In—Zn—O conductive oxide film, the urtra-thin film metal of Mg:Ag/In—Zn—O conductive oxide film was used.

Mg:Ag was 8 nm in thickness, and was formed by simultaneous evaporation. The transmission factor of this intermediate conductive layer was approximate 60%. When all of the cathode stripes of these groups of the light emitting element were kept at zero electric potential, the voltage of 15 V was supplied to all of the ITO stripes which were the anode, and nothing was connected to the intermediate conductive layer, current density of 3 mA/cm$^2$, brightness of 156 nit were obtained. The light-emitting efficiency was 5.2 cd/A.

As described above, in the case that the metallic urtra-thin film was utilized, although the transmission factor could not reached up to two times as compared with the comparison example 1, the element increased in brightness could be achieved. Since the mixed layer of the electron injection layer and the electron injecting ability compound was high in transparency, the element of the example 1 was more excellent. As described above, it has been found that use of the intermediate conductive layer which the transmission factor is larger than 60%, and is transparent and is capable of injecting both hole and electron is preferable.

Example 4

An example 4 is an example of a planar light emitting source which possesses the intermediate conductive layer.

The substrate that on a glass substrate of 25 cm×75 cm×1.1 mm in size, an ITO (an indium tin oxide) electrode is deposited by 120 nm was set as a transparent supporting substrate. This ITO was pattern-processed into a shape of 22 mm×30 mm.

Next, as the interlayer insulation film, V259 which is a transparent acrylate resin (made by Shinnippon seitetu kagaku Co., ltd.) was applied by spin coating with 1.2 μm in thickness. Subsequently, this substrate was heated at the temperature of 200° C. to heat-cure an interlayer insulation film constituted by V259.

Subsequently, on this V259 layer a photoresist was applied, and such that opening patterns of 20 mm×25 mm are remained, exposure and development was performed through the photo mask. Furthermore, after drying this substrate at the temperature of 200° for one hour, using the photoresist as the mask, reactive ion etching using oxygen gas was performed, thereby the interlayer insulation film of the opening being removed.

Subsequently, to this substrate, ultrasonic cleaning was performed in isopropyl alcohol for five minutes, and in addition, cleaning using both an ultra violet and ozone simultaneously was performed for 30 minutes.

On this transparent supporting substrate, poly (2-methoxy-5-(2-ethylhexyloxy)-1, 4-phenylanevinylane), (MEH-PPV) which was a conjugated system polymer was synthesized in accordance with the bibliography (The Synthetic Metal, Vol. 66, Page 75, 1994). From the xylene solution of 1.5 weight percent of MEH-PPV, the light emitting layer was deposited by 120 nm.

This was dried in a vacuum at 80°, and in addition, on this layer, the layer of 1:1 of Alq (aluminum complex of 8-hydroxyquinoline) and metallic Li was vacuum-evaporated by 20 nm as the electron injection layer. Although this Alq:Li layer acts as an electron injection layer, it may be considered as a part of the intermediate conductive layer, and the electron injection to the light emitting layer is performed.

The substrate (the substrate shown in FIG. 5 (D)) which the described-above depositions were performed was transferred to the vacuum chamber for sputtering coupled from a chamber for vacuum evaporation to this vacuum chamber. And then, as part of the intermediate conductive layer, In—Zn—O was deposited by 11 nm. The In—Zn—O was deposited using an In—Zn—O sputtering target of atomic ratio of 0.83 represented by In/(In/Zn), with the sputtering power output 1.2 W/m² using the mixed gas of Ar:O₂ of volume ratio 1000:1 as an atmosphere.

Subsequently, on the substrate which the described-above deposition are completed, further, from the xylene solution of 1.5 weight percent of MEH-PPV, the light emitting layer was deposited by 120 nm. This was dried in a vacuum at 80° C., and in addition, on this layer, the layer of 1:1 of Alq (aluminum complex of 8-hydroxyquinoline) and metallic Li was vacuum-evaporated by 20 nm as the electron injection layer. Metallic Li and Alq were evaporated with the mole ratio of 1:1 simultaneously. Finally, In was deposited in the film thickness of 1.7 μm using the mask for evaporating a cathode and to be set as a cathode.

With this description, preparation was completed, and when the cathode of this planar light emitting element were kept at zero electric potential, the voltage of 11 V was supplied to the ITO which is the anode, and nothing was connected to the intermediate conductive layer, current density of 30 mA/cm², brightness of 1400 nit were obtained The light-emitting efficiency was 4.7 cd/A.

Comparison Example 2

A comparison example 1 is the case of the prior plane type light emitting element.

The element were prepared in same manner as the example 4. However, omitting the In—Zn—O intermediate conductive layer and the light emitting layer and the electron injecting layer of the second times, the element of the prior structure were constituted. When the cathodes of the group of the light emitting element were kept at zero electric potential and the voltage of 5.2 V was supplied to the ITO which were the anode, current density of 30 mA/cm², brightness of 750 nit were obtained. The light-emitting efficiency was 2.5 cd/A.

According to the above description, although in the element of the example 4, the voltage becomes approximate two times as compared with the comparison example 2, the light-emitting efficiency becomes approximate two times, whereby it is found that the increase in brightness is possible.

Comparison of lifetime of prior light emitting element and lifetime of the invention.

At the initial brightness of 200 nit and under constant-current driving, a lifetime test was performed. The lifetime of the element of the comparison example 2 was 500 hours. When the element of the example 4 of the invention was performed at the same brightness, the lifetime was elongated to 1300 hours.

When at the initial brightness of 400 nit and under constant-current driving, a lifetime test was performed, in the case that the brightness of the element of the example 4 was two times as compared with the comparison example 2, the lifetime was 470 hours, and was comparable to that obtained for comparative example 2.

Therefore, it is found that according to the invention, at a high brightness a comparably lifetime can be obtained, and at a comparable brightness, a lifetime is elongated significantly.

Moreover, the present invention can not be limited to the embodiments and comprises the structure which can achieve the objects of the invention.

For example, although in the first and the second embodiments, the pixels (the organic EL light emitting element 6) are arranged in two dimensions, the pixels may be aligned in a row along with the direction of the X- or Y-axis, that is to say, may be one dimension arrangement.

Moreover, although in the first embodiment, one intermediate conductive layer 4 is arranged in each pixel and in the second embodiments, two intermediate conductive layers 4 are arranged, as far as being within the range of one or more and less than 100, the number "n" of the intermediate conductive layer 4 may be optional. That is to say, as far as being within the range of $1 \leq n \leq 100$, it may be optional.

Moreover, the structure of the organic layer 5 is not cared in particular, and the electron injection layer may be provided between the cathode and the light emitting layer, the hole injecting layer may be provided between the anode and the light emitting layer or these electron injection layer and hole injecting layer also maybe provided on the both sides, that is, as far as it is the structure including at least the organic light emitting layer, every kind of layer-structure may be acceptable.

According to an organic light emitting element of the invention, the element has the structure that a plurality of organic light emitting layers are arranged, between a transparent electrode and an opposed electrode, in a manner to sandwich an intermediate conductive layers in the intermediate position, whereby, as compared with the prior element, the scanning line current can be suppressed, as well as the responsibility can be improved. Therefore, according to the light emitting device using this organic light emitting layer, a large size and high-resolution display can be realized inexpensively.

What is claimed is:

1. An organic EL light emitting element comprising:
   a transparent electrode;
   an opposed electrode arranged in a manner to oppose to the transparent electrode;
   an intermediate conductive layer; and
   a plurality of organic light emitting layers arranged between said transparent electrode and said opposed electrode in a manner to sandwich said intermediate conductive layer in an intermediate position.

2. The organic EL light emitting element according to claim 1, wherein a number "n" of said intermediate conductive layer is $1 \leq n \leq 100$.

3. The organic EL light emitting element according to claim 2, wherein said transparent electrode, said intermediate conductive layer and said opposed electrode are laminated in a manner to overlap each other in viewing on a plane.

4. The organic EL light emitting element according to claim 2, wherein
   a first unit light emitting element arranging an organic light emitting layer between said transparent electrode and a first intermediate conductive layer; and
   an "n" th unit light emitting element arranging the organic light emitting layer between an "n" th intermediate conductive layer and said opposed electrode are arranged side by side on one plane.

5. The organic EL light emitting element according to claim 2, wherein a first unit light emitting element arranging an organic light emitting layer between said transparent electrode and a first intermediate conductive layer; and
   an "n" th unit light emitting element arranging the organic light emitting layer between an "n" th intermediate conductive layer and said opposed electrode possess at least a rectifying ability.

6. A light emitting device, wherein the organic light emitting elements comprising:
- a transparent electrode;
- an opposed electrode arranged in a manner to oppose to the transparent electrode;
- an intermediate conductive layer; and
- a plurality of organic light emitting layers arranged between said transparent electrode and said opposed electrode in a manner to sandwich said intermediate conductive layer in an intermediate position;
- are arranged as pixels in one dimension or in two dimensions.

7. The light emitting device according to claim 6, wherein the number "n" of said intermediate conductive layer is $1 \leq n \leq 100$.

8. The light emitting device according to claim 7, wherein said transparent electrode, said intermediate conductive layer and said opposed electrode are laminated in a manner to overlap each other in viewing on a plane.

9. The light emitting device according to claim 7, wherein a first unit light emitting element arranging an organic light emitting layer between said transparent electrode and a first intermediate conductive layer; and an "n" th unit light emitting element arranging the organic light emitting layer between an "n" th intermediate conductive layer and said opposed electrode are arranged side by side on one plane.

10. The light emitting device according to claim 7, wherein a first unit light emitting element arranging an organic light emitting layer between said transparent electrode and a first intermediate conductive layer; and an "n" th unit light emitting element arranging the organic light emitting layer between an "n" th intermediate conductive layer and said opposed electrode possess at least a rectifying ability.

* * * * *